United States Patent
Deutsch et al.

(10) Patent No.: US 10,845,416 B2
(45) Date of Patent: Nov. 24, 2020

(54) SOFTWARE-BASED SELF-TEST AND DIAGNOSIS USING ON-CHIP MEMORY

(71) Applicant: DUKE UNIVERSITY, Durham, NC (US)

(72) Inventors: Sergej Deutsch, Durham, NC (US); Krishnendu Chakrabarty, Chapel Hill, NC (US)

(73) Assignee: DUKE UNIVERSITY, Durham, NC (US)

( * ) Notice: Subject to any disclaimer, the term of this patent is extended or adjusted under 35 U.S.C. 154(b) by 267 days.

(21) Appl. No.: 15/827,200

(22) Filed: Nov. 30, 2017

(65) Prior Publication Data

US 2018/0095128 A1    Apr. 5, 2018

Related U.S. Application Data

(62) Division of application No. 14/265,501, filed on Apr. 30, 2014, now Pat. No. 9,864,007.

(51) Int. Cl.
*G01R 31/14* (2006.01)
*G01R 31/00* (2006.01)
*G01R 31/3185* (2006.01)
*G01R 31/28* (2006.01)
*G06F 11/263* (2006.01)
(Continued)

(52) U.S. Cl.
CPC . *G01R 31/318547* (2013.01); *G01R 31/2834* (2013.01); *G06F 11/263* (2013.01); *G11C 29/36* (2013.01); *G11C 29/40* (2013.01); *G11C 29/44* (2013.01); *G11C 29/4401* (2013.01); *G11C 29/56004* (2013.01); *G11C 5/04* (2013.01)

(58) Field of Classification Search
CPC ........ G01R 31/318547; G01R 31/2834; G06F 11/263; G11C 29/36; G11C 29/40; G11C 29/44; G11C 29/4401; G11C 29/56004
USPC .......................................................... 702/117
See application file for complete search history.

(56) References Cited

U.S. PATENT DOCUMENTS 6,586,924 B1    7/2003    Okayasu et al.
7,262,621 B1    8/2007    Caffee et al.
(Continued)

OTHER PUBLICATIONS

Karimi, F. et al., "Data Compression for System-on-Chip Testing using ATE," Proceedings of the 17th IEEE International Symposium on Defect and Fault Tolerance in VLSI Systems (DFT'02), 2002, pp. 166-174.
(Continued)

*Primary Examiner* — Michael P Nghiem
(74) *Attorney, Agent, or Firm* — Talem IP Law, LLP

(57) ABSTRACT

Embedded processor-based self-test and diagnosis using the compressed test data is described for ICs having on-chip memory. Techniques for compressing the test data before the compressed test data is transferred to a device under test (DUT) are also described. A modified LZ77 algorithm can be used to compress strings of test data in which don't care bits are handled by assigning a value to the don't care bits according to a longest match in the window as the data is being encoded. The compressed test data can be decompressed at the DUT using a software program transferred by the automated test equipment (ATE) to the DUT with the compressed test data. Decompression and diagnostics can be carried out at the DUT using an embedded processor and the on-chip memory. Results from the diagnostics can be read by the ATE.

10 Claims, 11 Drawing Sheets

(51) Int. Cl.
*G11C 29/36* (2006.01)
*G11C 29/40* (2006.01)
*G11C 29/44* (2006.01)
*G11C 29/56* (2006.01)
*G11C 5/04* (2006.01)

(56) References Cited

U.S. PATENT DOCUMENTS

| | | | |
|---|---|---|---|
| 8,125,357 B1 | 2/2012 | Hamlet et al. | |
| 8,560,903 B2 | 10/2013 | Wang et al. | |
| 9,864,007 B2* | 1/2018 | Deutsch | G01R 31/318547 |
| 2002/0175840 A1 | 11/2002 | Kugai | |
| 2003/0204797 A1 | 10/2003 | Lin | |
| 2004/0205437 A1 | 10/2004 | Yao et al. | |
| 2005/0138500 A1 | 6/2005 | Sul et al. | |
| 2007/0016836 A1 | 1/2007 | Rajski et al. | |
| 2007/0153775 A1 | 7/2007 | Renschler | |
| 2009/0254788 A1* | 10/2009 | Cervantes | G01R 31/318335 714/733 |
| 2011/0055644 A1 | 3/2011 | Chen et al. | |
| 2011/0179324 A1 | 6/2011 | Lai et al. | |
| 2012/0239995 A1 | 9/2012 | Gizdarski | |
| 2013/0051158 A1 | 2/2013 | Matsuo | |
| 2013/0173979 A1 | 7/2013 | Goessel et al. | |
| 2014/0032986 A1 | 1/2014 | Wan et al. | |
| 2014/0229778 A1* | 8/2014 | Tekumalla | G01R 31/318536 714/726 |
| 2014/0365838 A1* | 12/2014 | Tekumalla | G01R 31/318547 714/726 |
| 2015/0067426 A1* | 3/2015 | Nardini | G01R 31/318547 714/727 |
| 2015/0316605 A1* | 11/2015 | Deutsch | G01R 31/2834 702/117 |
| 2018/0095129 A1* | 4/2018 | Deutsch | G01R 31/318547 |

OTHER PUBLICATIONS

Nelson, Mark, "LZW Data Compression" Oct. 1, 1989. http://www.drdobbs.com/architecture-and-design/lzw-data-compression/184408217.

Wang, Z. et al., "Test Data Compression for IP Embedded Cores Using Selective Encoding of Scan Slices," IEEE International Test Conference, 2005, paper 24.3, pp. 1-10.

Wolff, F. G. et al., "Multiscan-based Test Compression and Hardware Decompression Using LZ77," IEEE International Test Conference, 2002, paper 11.4, pp. 331-339.

Ziv, J. et al., "A Universal Algorithm for Sequential Data Compression," IEEE Transactions on Information Theory, vol. IT-23, No. 3, May 1977, pp. 337-343.

Non-Final Office Action issued in U.S. Appl. No. 15/827,266, dated Dec. 16, 2019, 14 pages.

* cited by examiner

```
i, j, count = 0
while (j < S)
    if (e[i] AND (e[i+1] XOR a[j]))
        error_list[count++]=j
    i=i+1+e[i]
    j=j+1
```

SOFTWARE-BASED SELF-TEST AND DIAGNOSIS USING ON-CHIP MEMORY

CROSS-REFERENCE TO RELATED APPLICATIONS

"This application is a divisional of U.S. Non-Provisional Application Ser. No. 14/265,501, filed on Apr. 30, 2014, which issued as U.S. Pat. No. 9,864,007."

This invention was made with government support under Federal Grant No. CCF-1017391 awarded by the National Science Foundation. The government has certain rights in the invention.

BACKGROUND

Due to continued advances in CMOS technology, the number of devices integrated on a single chip keeps increasing at a rapid rate with each generation. Recent progress in 3D stacking using through-silicon vias (TSVs) as well as decreasing feature size has enabled even denser integration in a single package. Today's complex System-on-Chips (SoCs) also integrate a large number of digital-logic components besides microprocessors, for instance, audio and video encoders, graphic cores, and various I/O controllers. All these components, including the glue logic, need to be tested efficiently to manage test cost. However, in order to test such complex chips, a large number of test vectors are required, thereby resulting in high test-data volume and test time. Test-data compression is now widely used to reduce test-data volume and test time, and overcome tester limitations related to memory, data transfer rates, and pin counts.

There continues to be the need for even more effective test-data compression and efficient test-application methods in order to manage escalating test cost. Fortunately, ICs have the potential to integrate a large amount of fast memory with high bandwidth and low access time in a single package, opening up new opportunities for using on-chip resources for test application.

BRIEF SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Software-based self-test is described for ICs with on-chip memory including 3D ICs having at least one memory die and 2D (such as traditional non-stacked) ICs with embedded memory. Compressed test data can be decompressed at the device under test (DUT) using a software program transferred to the DUT with the compressed test data. In some implementations a diagnostic program can also be transferred to the DUT in order to perform on-chip diagnosis. For implementations incorporating an on-chip diagnostic program, expected response data can also be transferred to the DUT in a compressed form and then decompressed at the DUT using the software program for decompressing the compressed data. The ATE can read the results of the diagnostic program from the memory of the IC.

In addition to manufacturing test, software-based self-test can also be used for in-field (online) test using deterministic scan patterns, while providing high-resolution diagnostic capabilities.

Techniques for compressing test data applied to a module under test are described. According to an example implementation, a modified LZ77 algorithm compresses strings of test data and handles don't care bits by assigning a value to the don't care bits according to a longest match in the window as the data is being encoded.

DETAILED DISCLOSURE

Techniques and systems for test-data compression, on-chip test application, and on-chip fault diagnosis for an integrated circuit (IC) with on-chip memory are disclosed.

Examples of ICs with on-chip memory include, but are not limited to, a three dimensional (3D) IC stack with wide I/O dynamic random access memory (DRAM) and ICs with embedded DRAM (eDRAM).

A 3D IC refers to a large class of chips that incorporate electronic components both vertically and horizontally. 3D ICs may include electrical components and wiring that are built as layers on a single wafer and/or electrical components that are fabricated on separate wafers (or different dies on the same wafer) and then bonded together. Connections between vertical components may be built into the wafers and/or provided by through silicon vias (TSVs) and micro-bumps.

One popular 3D IC arrangement is memory-on-logic based on wide-I/O DRAM. Wide I/O memory refers to a DRAM technology and JEDEC (a standards organization for the microelectronics industry) standard that currently provides a 512-bit wide interface and high bandwidth (e.g., above 10 GB/second bandwidth). JEDEC Wide I/O DRAM standard (JESD229) enables chip-level 3D stacking with TSV interconnects where memory chips are directly stacked upon a System on a Chip (SoC). SoC generally refers to the integration of processor(s), peripheral component(s), and physical memory as part of a same silicon chip or as a stack of chips bonded or otherwise packaged together. The memory-on-logic 3D ICs are finding many applications in mobile devices and other small form-factor applications.

SoCs often include microprocessors, audio and video encoders, graphic cores, and various I/O controllers. An SoC may include multiple processors with surrounding areas of digital logic.

Figure 1A:
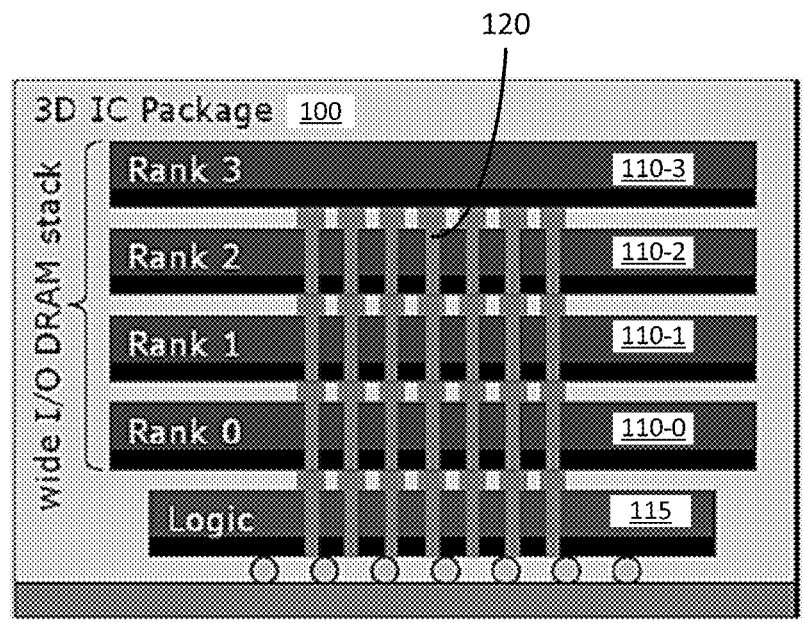
FIG. 1A illustrates a 3D IC with a wide-I/O DRAM stack in which certain implementations of software-based self-test may be embodied.

FIG. 1A illustrates a 3D-stacked IC with a wide-I/O DRAM stack in which certain implementations of software-based self-test may be embodied. In particular, FIG. 1A shows a 3D IC package 100 with four wide-I/O DRAMs 110-0, 110-1, 110-2, and 110-3 stacked on top of a logic die 115 and electrically connected through TSVs 120. The standardized functional interface (JEDEC standard) defines four independent memory channels of 128 bi-directional DQ data bits each, totaling 512 data bits over all four channels. The maximum data rate is 266 Mbps (single data rate), which offers a total logic-memory bandwidth of 512×0.266/8=17 GByte/s.

Figure 1B:
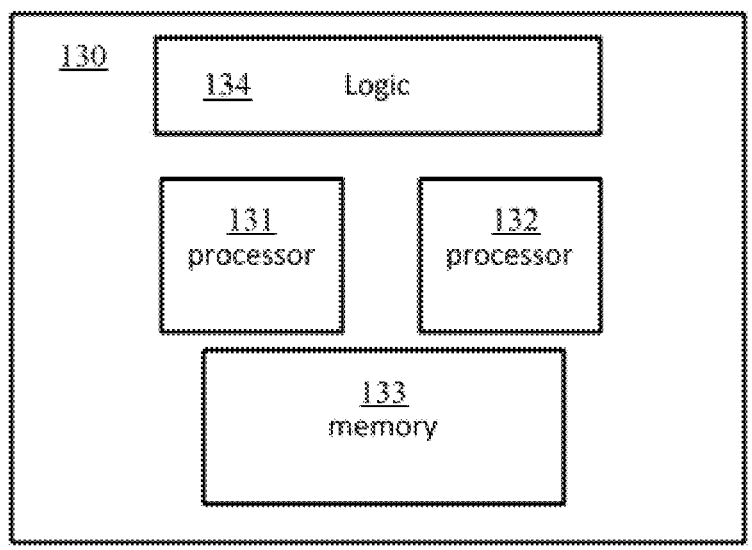
FIG. 1B illustrates a System on Chip (SoC) in which certain implementations of software-based self-test may be embodied.

FIG. 1B illustrates a System on Chip (SoC) in which certain implementations of software-based self-test may be embodied. Referring to FIG. 1B, an SoC 130 can include a first processor 131, a second processor 132, a memory 133 (e.g., cache memory, other on-chip memory), and logic 134. The SoC 130 may be a stand-alone chip (and package) or may be part of a 3D-IC.

ICs and other semiconductor devices with on-chip memory, (including 3D ICs with wide I/O DRAM stacks such as shown in FIG. 1A and 2D ICs such as shown in FIG. 1B) are tested at various stages of the manufacturing process.

Figure 2:
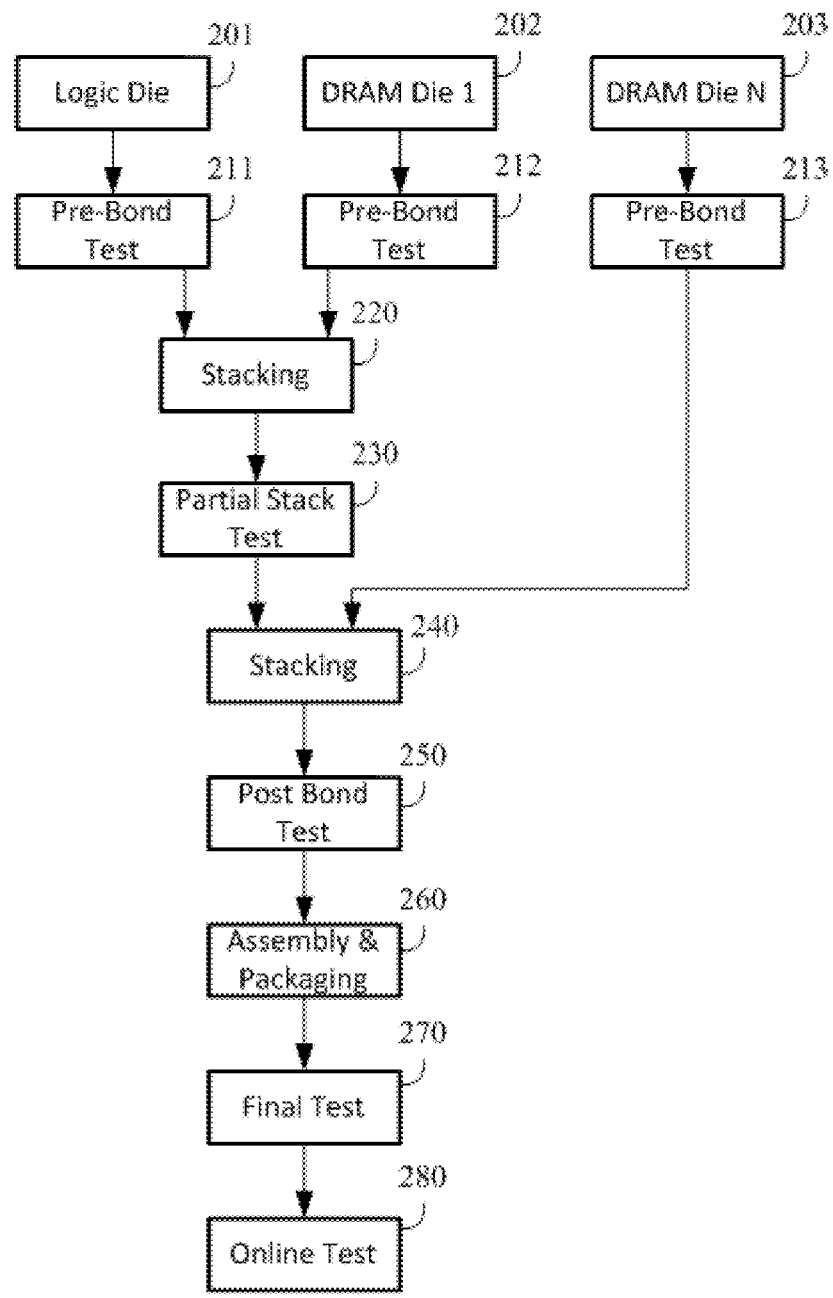
FIG. 2 illustrates a test flow for a 3D IC in which the described software-based test and diagnosis may be applied.

FIG. 2 illustrates a test flow for a 3D IC in which the described software-based test and diagnosis may be applied. Referring to FIG. 2, a logic die 201, a first DRAM die 202, and a second (or more) DRAM die 203 may be fabricated and tested using any suitable pre-bond testing methods (211, 212, 213). Examples of pre-bond testing methods include scan test for the logic die using hardware decompression (e.g., XOR-based decommpressors) and memory tests for the DRAM dies.

After at least one DRAM die has been added to the stack (during stacking steps 220), the 3D IC has DRAM available for functional operations. At this time, a scan test can be performed using the described software-based testing. The partial stack testing (220) can be performed to re-test the logic in the logic die 201 and may be performed as each DRAM die is stacked (240). After the last die is stacked (240), post bond testing (250) may be performed using the described software-based testing; assembly and packaging (260) can be carried out; and a final test (270) can be performed using the described software-based testing. Even for SoCs that do not include DRAM memory stacked on the logic, the software-based testing described herein may be applied if there is on-chip memory available (such as eDRAM) in the package.

The described software-based testing can then be carried out in-field (280). For the in-field (or "online") testing (280), testing using deterministic patterns are possible by storing compressed patterns on the chip after the final test (270) is carried out. In the online testing, the test patterns may be adjusted to target specific faults.

Figures 11, 12:
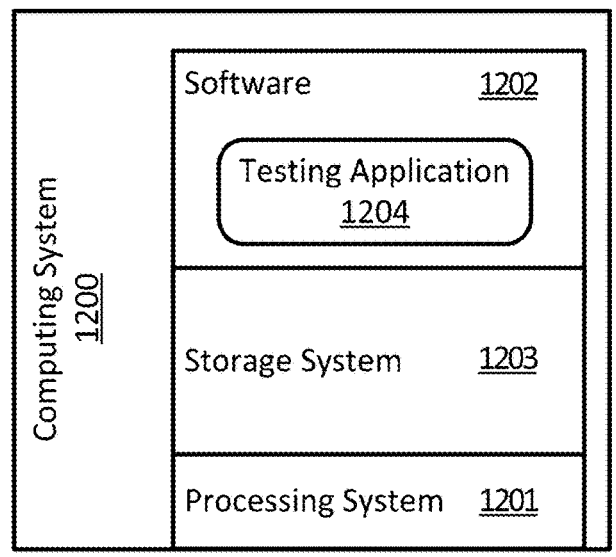
FIG. 11 shows an example algorithm for on-chip test-response comparison that may be used in certain implementations.
FIG. 12 illustrates a representative computing system that may be used to carry out certain implementations of the described integrated circuit (IC) testing.

As part of a testing environment (for tests other than in-field), automatic test equipment (ATE) technology may be used for verification, characterization and design debug of a module or device-under-test (DUT). Manufactured chips can be tested using ATE and on-chip design-for-test (DfT) components to determine parametric and logic faults, analog specifications, and perform burn-in or stress testing. The traditional components of ATE involve a computing system running a test program, signal processing instruments (usually for analog testing), a probe head and a probe card. The computing system can be configured with one or more processors, storage media, and input/output interfaces (including network interfaces, probe interfaces, user input interfaces, and audio and/or visual output interfaces to a corresponding speaker or display device). FIG. 12 illustrates a representative computing system that may be used to carry out certain implementations of the described compression for IC testing.

The availability of on-chip memory with a fast wide-I/O interface (and large amounts of memory) enables software-based decompression of test patterns transferred from the ATE. That is, 3D stacked ICs with wide I/O DRAMS and even some 2D ICs with on-chip memory have the bandwidth capable of handling software-based built-in self-test (BIST) solutions. The software-based BIST solutions can include test and diagnosis solutions that make use of software-based decompression of deterministic scan-test patterns and allow for test application from wide-I/O DRAM or other on-chip memory to a module under test.

In software-based test-data compression, compressed test patterns are transferred from the test equipment to on-chip memory. The compressed test patterns are decompressed on-chip by a processor (on the chip) using a software decompression program, and then applied to a logic module under test. The processor can be an embedded processor, for example on the logic die. In some cases, the software-based test-data compression provides a near-zero-overhead test solution for BIST as existing components can be used to carry out the testing.

Figure 3A:
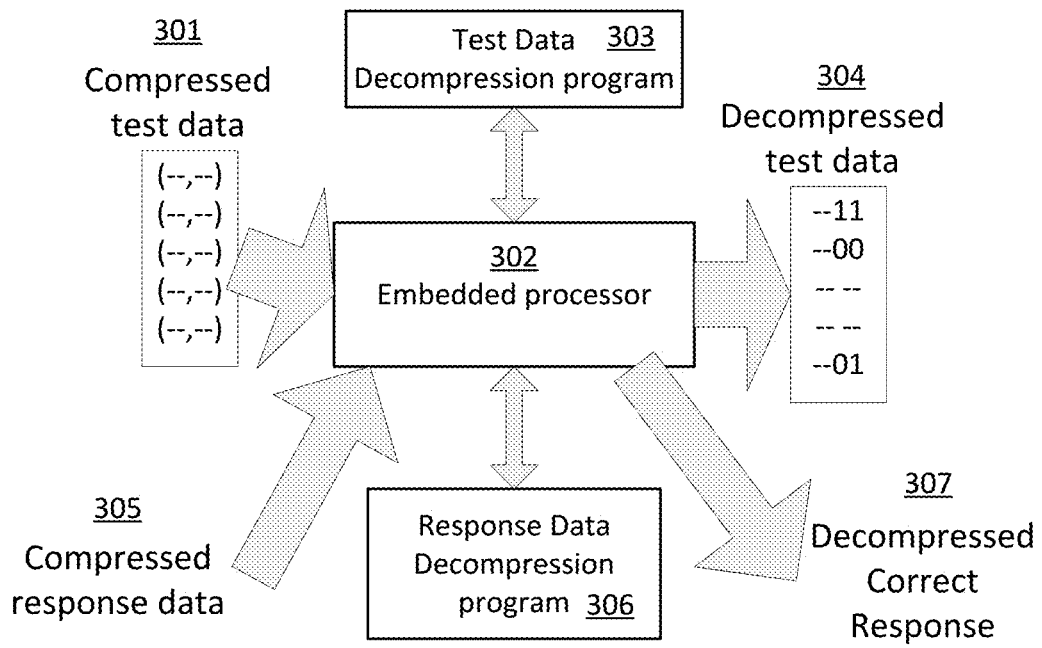
FIG. 3A illustrates a representative diagram of initialization procedures at a device-under-test (DUT).
Figure 3B:
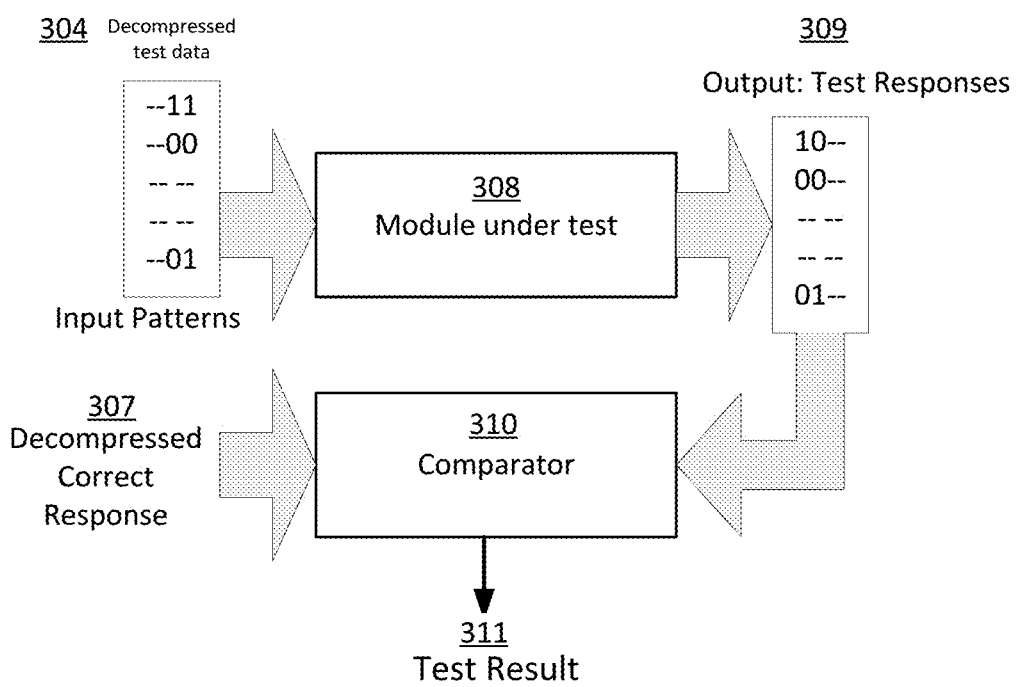
FIG. 3B illustrates a representative diagram of a diagnostic test procedure carried out by the DUT.

FIG. 3A illustrates a representative diagram of initialization procedures at a DUT; and FIG. 3B illustrates a representative diagram of a diagnostic test procedure carried out by the DUT. The procedures shown in FIGS. 3A and 3B may be carried out for partial stack testing 230, post bond testing 250, final testing 270, and even online testing 280 as some examples.

Referring to FIG. 3A, compressed test data 301 can be decompressed by an embedded processor 302 of the DUT using a test data decompression program 303. The compressed test data 301 may be stored in the on chip memory (e.g., DRAM) of the DUT along with the test data decompression program 303 and accessed by the embedded processor 302 to carry out the decompression and write the decompressed test data 304 back to memory.

"Similarly, for built-in diagnostic testing, compressed response data 305 that is stored in the on-chip memory of the DUT (when transferred from the ATE) can be decompressed by the embedded processor 302 using a response data decompression program 306. The decompressed response data 307 can be written back to memory. The test data decompression program 303 and the response data decompression program 306 may be the same or different programs depending on the encoding/compression format of the data."

"Referring now to FIG. 3B, once decompressed, the decompressed test data 304 from the on-chip memory are applied as input patterns to a module under test 308. The test responses 309 are stored back to the on-chip memory for diagnosis. On-chip diagnosis can be available through a comparison (e.g., via a stand-alone hardware comparator or a software-based comparison using an on-chip microprocessor 310) of the collected scan-out data 309 stored in on-chip memory against the decompressed correct response 307 that had been transferred from the ATE to the chip and decompressed. The test result 311 of the comparison can be stored in on-chip memory and read by the ATE (or used in-field)."

In some cases, instead of all the data being decompressed before test data are applied to a module under test, data decompression may be carried out as part of or during the diagnostic program or as the test data is applied to a module under test such that at least the data being used during a particular test period is decompressed, while other data remains compressed until needed.

The software-based compression/decompression and self-test approach relaxes the requirements on the ATE as both the test stimuli and the expected test responses are stored in a compressed form and the diagnosis is performed using on-chip resources. In addition, the diagnosis program can provide an output ranging from a single "pass-fail" bit to a comprehensive log with information about all miscompares, which can be used for silicon debug as well as for online test. The ATE can read the output of the diagnosis program and perform additional analysis or simply generate a report.

Figure 4:
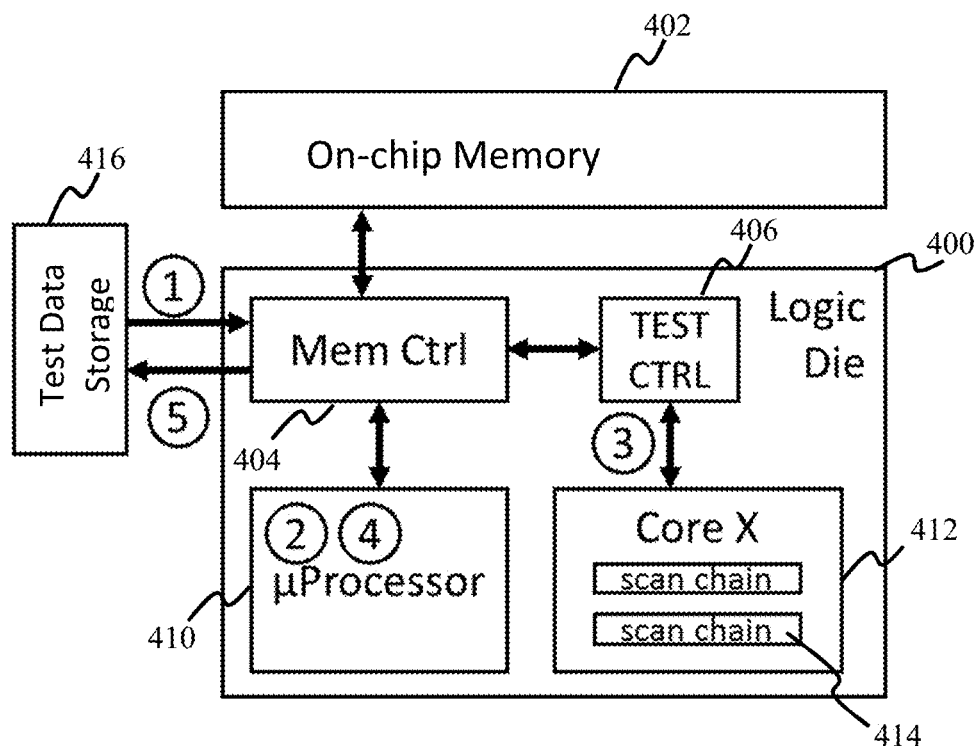
FIG. 4 illustrates a system block diagram with process flow of a test procedure that may be carried out on a DUT when implementing certain embodiments of the invention.

FIG. 4 illustrates a system block diagram with process flow of a test procedure that may be carried out on a DUT when implementing certain embodiments of the invention.

Referring to FIG. 4, a DUT can include a logic die 400 and an on-chip memory 402. The on-chip memory may include a wide I/O DRAM stack, embedded DRAM, or other on-chip memory for 2D or 3D ICs. The logic die 400 can include a memory controller (Mem Ctrl) 404, test control module (TEST CTRL) 406, processor 410 and core logic (core X) 412 with scan chains 414. DfT circuitry (from the scan chains 414 and test control module 406) at the logic die 400 facilitates the application of a scan test to a module under test (at core X 412) using decompressed test stimuli from the on-chip memory 402.

In Step 1, the compressed test data, a decompression program and a diagnosis program can be loaded from an external test data storage 416 into an on-chip memory 402 using, for example, a direct access mechanism of the memory controller 404. During a manufacturing test, an ATE interface can be used to receive and transfer data to and from the ATE providing the external test data storage 416. For online test, the external test data storage 416 may be a functional in-system data storage, such as a hard drive or a flash drive as some examples. In Step 2, an embedded processor 410 decompresses the test data and writes the decompressed test data back to the on-chip memory 402. In Step 3, the test mode is enabled, which allows the test-control circuitry 406 to read the test stimuli (decompressed test data) from the on-chip memory 402 and apply the test stimuli to the module under test 412. Test responses are then written back to the on-chip memory 402.

In Step 4, the processor 410 runs the diagnosis program that compares the actual responses with the expected responses. Miscompares can be written into the on-chip memory 402 as a log file. Finally, in Step 5, the log file is read from the on-chip memory 402, where the log file can be used for a simple pass-fail decision, binning, or debug. During manufacturing test, the ATE (via an ATE interface) may read the log file from the on-chip memory 402.

Figure 5A:
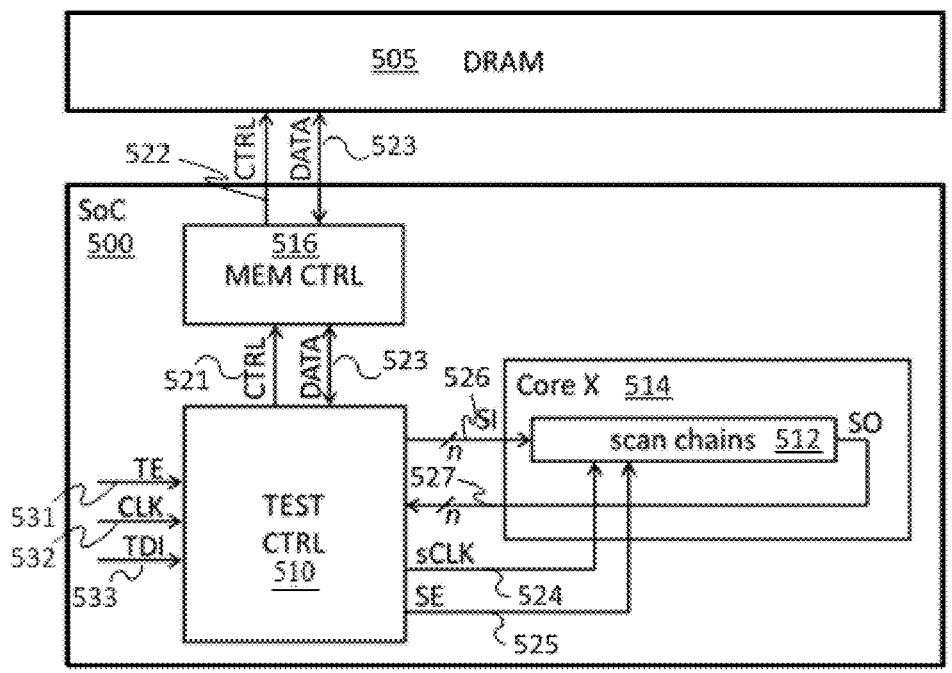
FIG. 5A illustrates a schematic of an integrated circuit (IC) with Design-for-Test (DfT) circuitry.
Figure 5B:
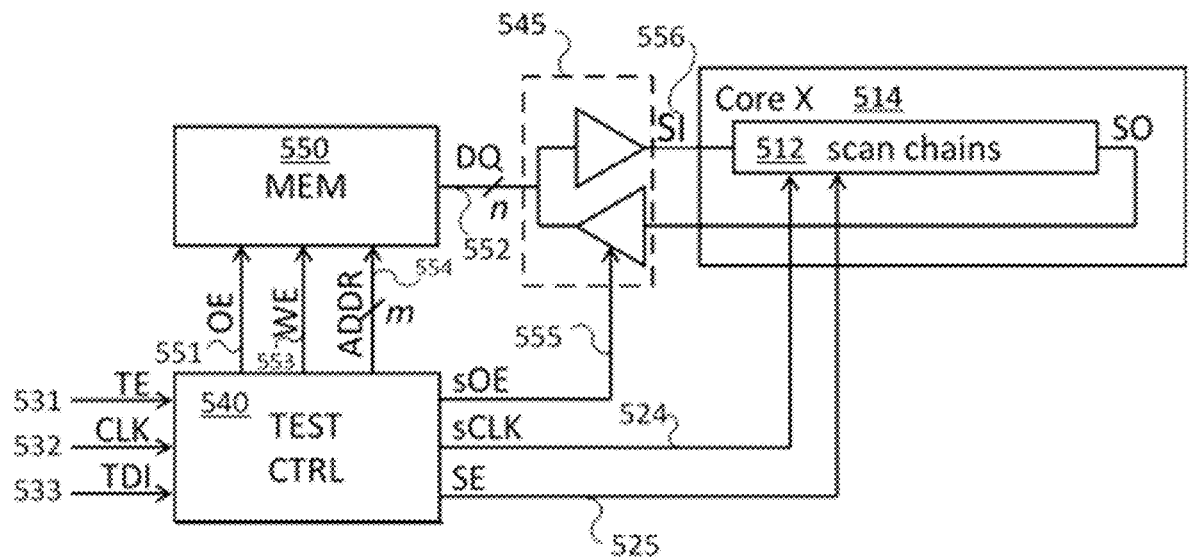
FIG. 5B illustrates a schematic of a DfT control circuitry used for experimental results.
Figure 5C:
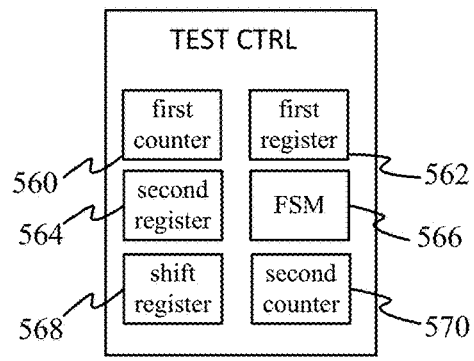
"Figure 5C illustrates an example implementation of a TEST CTRL module."
Figure 6:
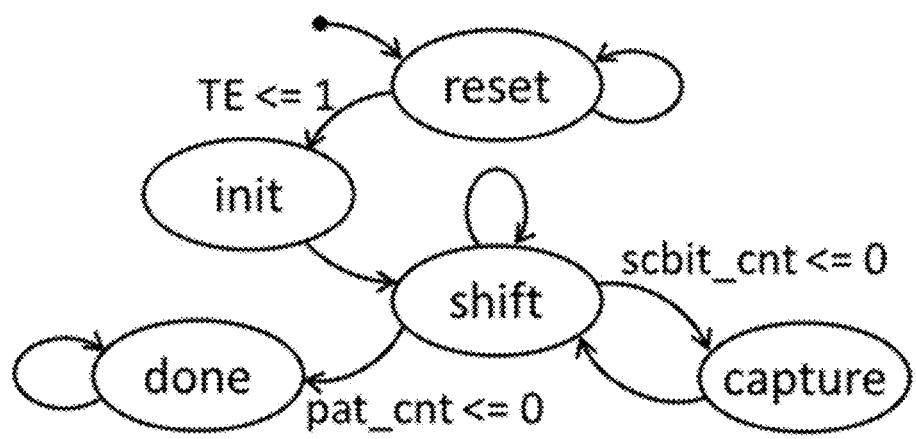
FIG. 6 illustrates a finite-state machine of TEST CTRL according to one implementation.

"Figure 5A illustrates a schematic of an integrated circuit (IC) with Design-for-Test (DfT) circuitry; FIG. 5B illustrates a schematic of a DfT control circuitry used for experimental results; FIG. 5C illustrates an example implementation of a TEST CTRL module; and FIG. 6 illustrates a finite-state machine of TEST CTRL according to one implementation."

FIG. 5A shows an IC in the form of an SoC 500 that includes embedded or stacked memory 505. In the implementation of FIG. 5A, TEST CTRL 510 can be a module, which may be embodied in hardware, software, or a combination of hardware and software, that generates control signals to the on-chip memory 505 and the scan chain(s) 512 to carry out testing of the core X 514 and enable both the reading of test data from and the writing of test results to the memory 505. A separate memory controller (MEM CTRL) 516 may be provided to translate instructions from the TEST CTRL 510 for the memory 505. The scan chains 512 may be connected to the memory controller 516 through an adapter or data bus.

As shown, the TEST CTRL 510 generates control signals 521 to the MEM CTRL 512, which then sends control signals 522 to the memory 505. Data 523 can be read and written to the memory through the control signals 521, 522. The TEST CTRL 510 also generates control signals that enable the testing of the core 514. For example, a scan clock (sCLK) 524 to the scan chain(s) 512, providing the scan clock, and shift enable (SE) 525 to the scan chain(s) 512, providing the shift enable signal can be generated by the TEST CTRL 510. Scan input (SI) 526 can be output to the scan chains 512 for testing (providing test data), and scan output (SO) 527 can be received from the scan chains 512 (providing result data).

The TEST CTRL 510 may receive, as input, the following signals: 1) TE 531, which is the test enable signal, 2) CLK 532, which is a functional clock, and 3) test-data-in (TDI) 533, which is a signal that may be used for scanning in configuration values. In some embodiments, the input signals TE 531, CLK 532, and TDI 533 can be provided from a joint test action group (JTAG) test access port (TAP) controller (see e.g., IEEE 1149.1 Standard Test Access Port and Boundary-Scan Architecture). Alternatively, the instruction set of the embedded processor can include an instruction that generates these three signals and triggers the test execution. In this case, the test may resemble a program that can be run in functional mode (which is suitable for online test).

In one implementation used simply for illustration in the experimental results, the functional blocks of MEM CTRL 516, TEST CTRL 510, and scan chain(s) 512 shown in FIG. 5A may be embodied as the DfT control circuitry of TEST CTRL 540, buffer 545 and scan chain(s) 512 as shown in FIG. 5B. It should be understood that the schematic shown in FIG. 5B is not intended to be limiting and that in many applications, the MEM CTRL 516 is used to enable communication between the DfT circuitry and on-chip memory (as shown in FIG. 5A).

In the specific implementation shown in FIG. 5B, TEST CTRL 540 may output the six following control signals: 1)

output enable (OE) 551 to the memory 550 (and/or memory controller) that enables the tri-state drivers of the memory DQ signals 552, allowing for reading data, 2) write enable (WE) 553 to the memory 550 (and/or memory controller) that enables the memory write mode, 3) ADDR 554 to the memory 550 (and/or memory controller) that selects a memory address to write to or to read from, 4) scan output enable (sOE) 555 to the buffer 545 that enables the scan-out tri-state drivers in order to write test responses into the on-chip memory (as SI 556), 5) the sCLK 524 to the scan chain(s) 512, and 6) the SE 525 to the scan chain(s) 512. The TEST CTRL 540 may receive the input signals TE 531, CLK 532, and TDI 533.

"Referring to FIG. 5C, a TEST CTRL module, according to certain implementations TEST CTRL 510, 540, can include the following structures: 1) a counter 560, scbit_cnt, holding the number of the current shift cycle, 2) two registers (a first register 562 and a second register 564) to hold, at least temporarily, the addresses of the current scan-in and scan out vectors, and 3) a finite-state machine (FSM) 566 that operates the test procedure. The FSM 566 can be stored in cache memory of the embedded processor of the 3D IC or implemented as programmable logic."

"In some implementations, the TEST CTRL 510, 540 can include a configuration shift register 568 connected to receive the TDI signal that holds, for example, the length of the scan chains, the number of test patterns, the memory address where the test stimuli are stored, and the memory address where to write test responses. In some implementations, aspects of the shift register 568 may be implemented by the processor or as separate logic from the TEST CTRL 510, 540."

"In some implementations, including the above described implementations, the two registers 562, 564 holding the addresses of the current scan-in and scan out vectors may temporarily store the addresses upon receipt of the information regarding the memory addresses that are appended to (or embedded in) the test data. In some implementations, including the above described implementations with or without the shift register 568, the two registers 562, 564 may be in the form of counters stim_addr_cnt and resp_addr_cnt, that hold the memory addresses of the current scan-in and scan-out vectors, respectively."

"In some implementations, including the above described implementations, the TEST CTRL 510, 540 can include a second counter 570, pat_cnt, holding the number of the current test pattern."

The implementation of the FSM depends on the type of test: stuck-at or at-speed tests such as launch-on-shift or launch-on-capture. An example FSM for a stuck-at test is described in FIG. 6. This FSM can be easily modified to change the capture procedure in order to perform other types of test.

Referring to FIG. 6, by default, the FSM may be in a reset state, resetting all counters. As part of the FSM functionality, when TE is asserted, the FSM moves to the "init" state to initialize the counters and/or registers. For example, the content of a configuration register may be copied into the corresponding counters. Then, the FSM switches into the shift state, in which scbit_cnt is decremented and SE is asserted, allowing for scanning in a full test pattern. The FSM then changes into the capture mode where a capture clock cycle is issued. In addition, for implementations incorporating the counter, pat_cnt, pat_cnt is decremented by one. Immediately after that, the FSM returns into the shift mode. The shift-capture iterations are repeated until the pattern count is zero and the FSM exits to the done state.

In this implementation, it is assumed that the data width of the memory is at least as large as the number of scan chains n. In this case, one read and one write operation are performed during one shift cycle. If DQ width is less than n, then the DQ output (see element 552 of FIG. 5B) can be multiplexed to multiple groups of scan chains that shift in a skewed fashion. For such an approach, the DfT circuitry would include additional features in order to pipeline scan-chain shifting in the shift state.

Figure 7:
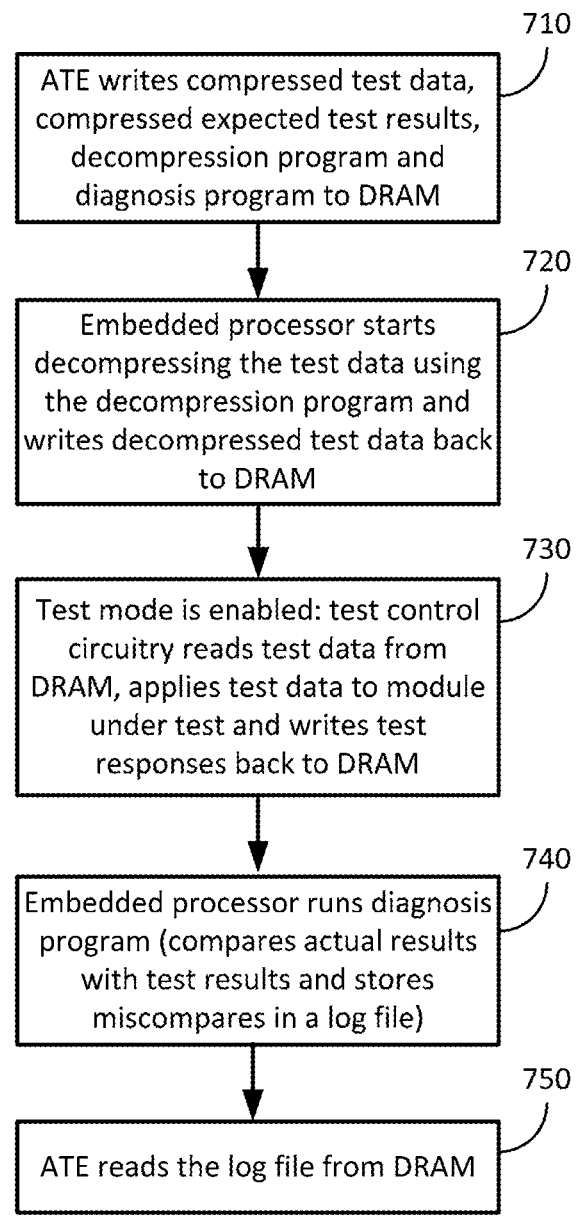
FIG. 7 illustrates a process flow of a test procedure that may be carried out when implementing certain embodiments of the invention.

FIG. 7 illustrates a process flow of a test procedure that may be carried out when implementing certain embodiments of the invention. Referring to FIG. 7, when a device is ready to be tested, the ATE can write compressed test data, compressed expected test results, a decompression program and a diagnosis program to the on-chip memory of the device under test (710). The embedded processor of the DUT, can start decompressing the test data using the decompression program and can write the decompressed test data back to on-chip memory (720). Once test mode is enabled, the test control circuitry can read the test data from on-chip memory, apply the test data to the module under test, and write the test responses back to the on-chip memory (730). The embedded processor can then run a diagnosis program that compares actual results with expected test results and can store the miscompares in a log file (740). The ATE can then read the log file from on-chip memory (750).

Accordingly, the amount of data and bandwidth needed for communication between the ATE and the DUT can be minimized through using compressed data that can be decompressed via software-based techniques at the DUT. Furthermore, through taking advantage of embedded processors and other logic, diagnostic applications can be run on-chip instead of at the ATE, minimizing the amount of data being communicated back and forth between the ATE and the DUT.

Advantageously, a large number of compressed deterministic test patterns, including test stimuli and expected test responses, can be loaded to the IC, and these test patterns can then be decompressed on-chip using a software program that is loaded with the test data. This approach is not limited to a particular compression technique; hence the techniques can be optimized for test-compression ratio even after the design stage. In addition, test-response diagnosis can be performed on-chip, thereby reducing the burden on the ATE.

Techniques and systems are described herein for software-based test compression (and decompression) and test application from on-chip memory to a module under test.

According to certain embodiments, software-based decompression is included as part of the BIST techniques incorporated onto a chip. By incorporating software decompression (as opposed to hardware-based decompression techniques), highly effective compression techniques such as LZ77-based algorithms (for example, LZW and DEFLATE) can be used. Test data and expected test responses can be compressed and transferred from the ATE to the DUT. A decompression program and test program can be written to the DUT by the ATE as well. Although LZ77-based algorithms are specifically described herein, the particular algorithm used to compress the data transferred from the ATE to the DUT (and thus the particular algorithm used to decompress the data at the DUT) may vary depending on implementation.

Figure 8A:
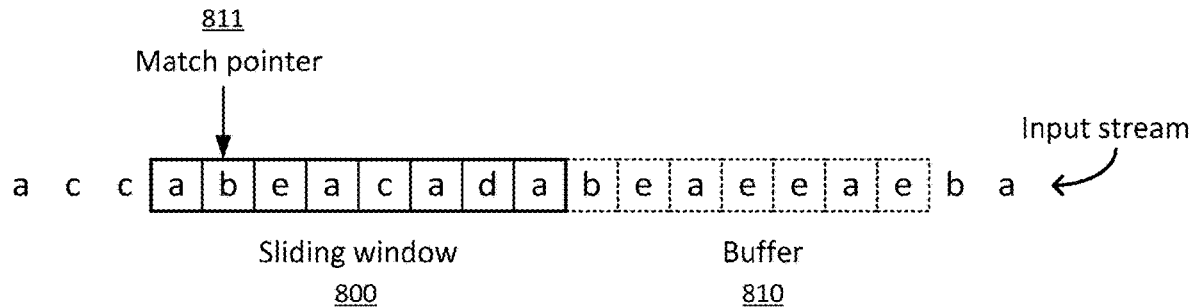
FIGS. 8A and 8B illustrate encoding and decoding, respectively, according to an LZ77-based algorithm that may be used in an implementation.
Figure 8B:
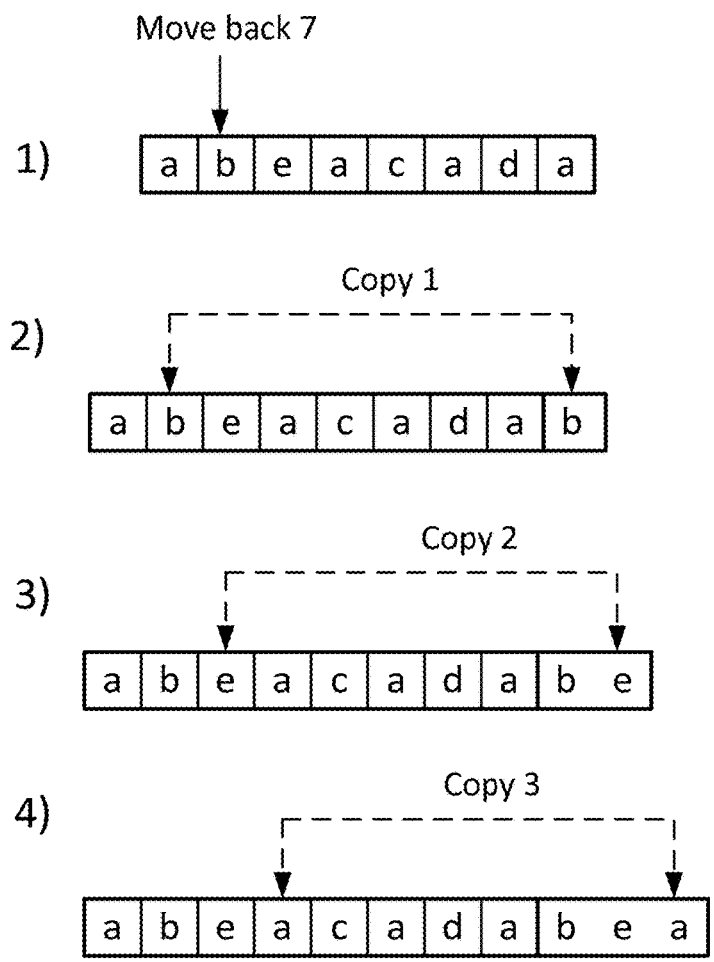

FIGS. 8A and 8B illustrate encoding and decoding, respectively, according to an LZ77-based algorithm that may be used in an implementation. In a conventional LZ77 algorithm for encoding data, such as described with respect to FIG. 8A, the encoder examines an input sequence of data to be encoded through a sliding window 800. In addition to the sliding window 800, which may also be referred to as a search buffer, a look-ahead buffer or "buffer" 810 is included from which strings from the sliding window 800 are matched as part of the compression algorithm. In some cases, a match pointer 811 can be used to keep track of the initial search position in the sliding window. The match pointer 811 can move down the sliding window 800 as a match is found for the string from consecutive symbols in the buffer 810.

An "offset" refers to the distance from the symbol to be encoded (e.g., position in the window 800) and a "length" refers to the number of consecutive symbols in the buffer 810 that match those in the sliding window 800. The match pointer 811 returns to each offset point in the sliding window 800 to possibly find a longer length match. Once the search is complete, the encoder encodes the information as offset and length. A flag can be used to indicate whether symbols are encoded or not encoded. For example, for the matching sequence b-e-a (starting at the match pointer 811), this matching string is converted into an offset O of 7 (from the right) and string length L of 3. A flag can be included indicating that the symbols are encoded.

In the original LZ77 algorithm, initially, the sliding window 800 is empty, so the first symbol of the input stream is stored uncompressed and both the window 800 and the buffer 810 are shifted by one symbol. Next, the second symbol of the input stream (first symbol in the buffer 810) is matched against the content of the window 800. If a match is found, the algorithm attempts to find a match in the window 800 for the sequence consistent with the first and the second symbol of the buffer 810. In this case, no match will be found as the window 800 contains only one symbol. In general, this procedure repeats multiple times until no match can be found. The longest sequence of the buffer 810 that matches a sequence in the window 800 is then coded as the offset O of the matching sequence in the window 800 and its length L. The window 800 and the buffer 810 are then shifted by L. A flag bit identifies whether a sequence is stored compressed or uncompressed. If the code length of a matched sequence exceeds the size of the uncompressed sequence, the sequence can be stored uncompressed. The matching and sliding procedures repeat until the buffer 810 is empty.

The decompression of the compressed stream can be accomplished by maintaining a window for looking up coded sequences. The decoding, or decompression, process can be performed by going to the offset in the window and copying the specified number of symbols. For example, a window can be initialized to a known value, the flag indicating whether or not the symbols are encoded can be read, and if the flag indicates that the symbols are encoded, the length and the offset are read and the specified number of symbols is copied from the window as decoded output. For the example O=7 (from the right of the sliding window 800), L=3 from FIG. 8A, the process begins by moving back 7 places in the window (such as shown in line 1 of FIG. 8B), then copying the three characters from that position into the decoded output location (such as sequentially shown in lines 2, 3, and 4 of FIG. 8B).

If the flag indicates that the symbols are not encoded, then the next character in the window is read and copied (i.e., written) as decoded output. A copy of the symbols written to the decoded output are shifted into the window and the flag for the next input is read (and appropriate action taken) until the entire input is decoded.

The LZ77 algorithm such as described above is suitable for some of the data being transferred onto the DUT. For example, the expected test responses used in a diagnostic program can be compressed using the LZ77 algorithm (once masked data is converted using, for example, Huffman codes).

In one implementation, an LZ77-based algorithm is used to achieve high compression ratio by exploiting unspecified bits in the test-data stream. According to various implementations, a modified LZ77 algorithm is used to compress the test data at the ATE (or at another system and loaded onto the ATE in preparation of use). The compressed test data can be stored in the tester memory (or on-chip memory of the DUT) in case of manufacturing test or in the system memory (e.g., cache memory) for online test, and decompressed into wide-I/O DRAM or other on-chip memory using an on-chip processor.

Figure 9:
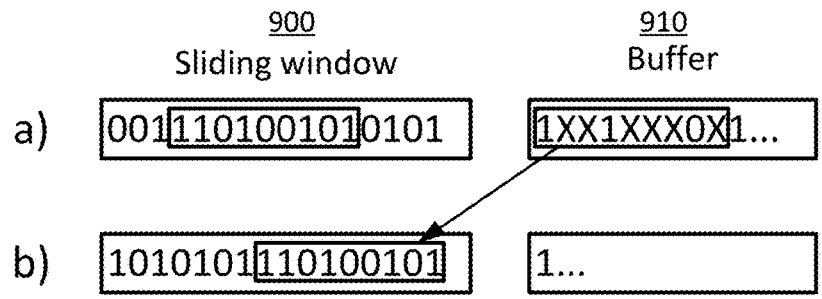
FIG. 9 illustrates an X-replacement while matching sequences according to a test procedure that may be carried out when implementing certain embodiments of the invention.

The modified LZ77 algorithm described herein involves replacing X (don't care) values during sequence matching. FIG. 9 illustrates an X-replacement while matching sequences according to a compression procedure that may be carried out when implementing certain embodiments of the invention. A sliding window 900 and buffer 910 are illustrated. In the modified LZ77 algorithm, values are assigned to unspecified bits (Xs) in the buffer 910 such that the length of the matched sequence is maximized. A greedy X-replacement scheme may be used that takes into account only the current content of the window and the buffer, hence no pre-processing of the data stream is required. Don't cares (Xs) are assigned values while matching a string in the buffer 910 to a string in the window 900 (referred to herein as a match-bit value since the don't care value is assigned a value that matches the corresponding position bit in the window). This is depicted in FIG. 9 where the input stream can include don't cares (Xs), but are assigned match-bit values before shifting into the window. For example, line a) of FIG. 9 shows the longest matching sequence "1XX1XXX0X"→"110100101" with the offset (from the left) of three (where no offset is the leftmost position in this example) and the length of nine, which is stored as a token (3,9). Then, the Xs are replaced by the values corresponding to the match and the window slides by nine symbols, as shown in line b) of FIG. 9.

Figure 10:
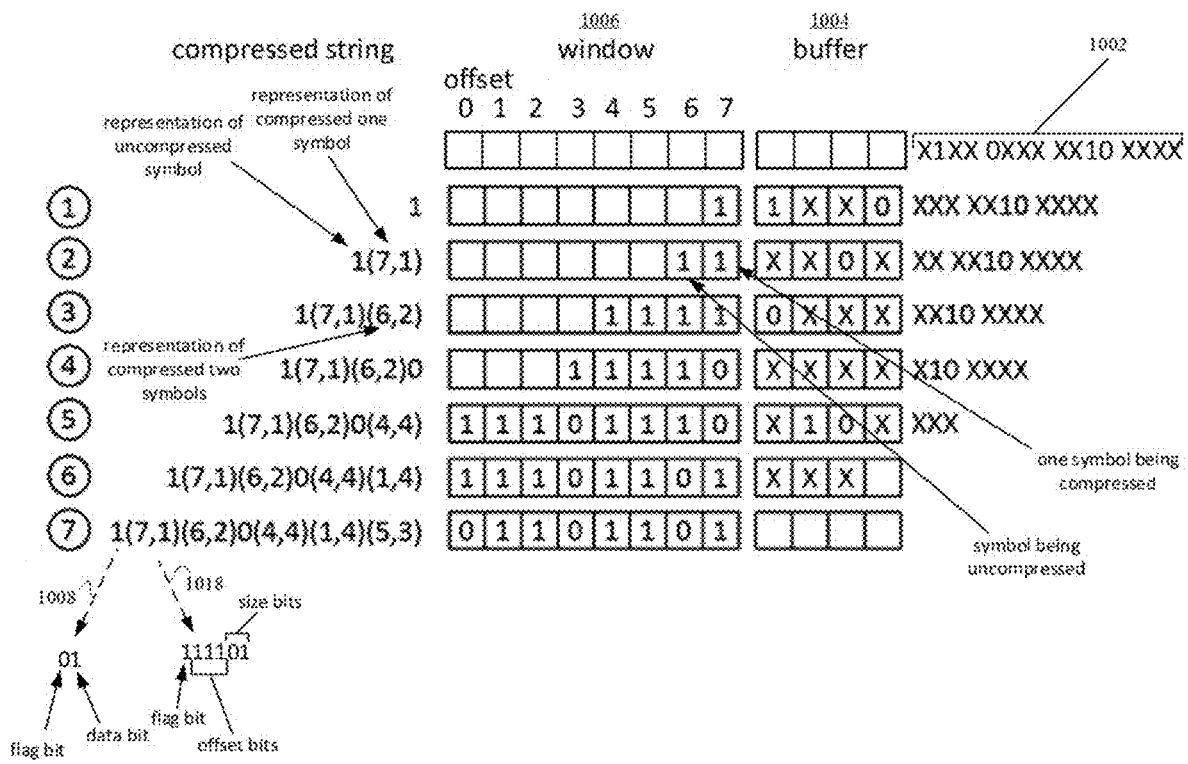
FIG. 10 illustrates an example of a compression procedure for a test pattern containing don't care bits using the described modified LZ77-based algorithm.

FIG. 10 illustrates an example of a compression procedure for a test pattern containing don't care bits using the described modified LZ77-based algorithm. In the example illustrated in FIG. 10, a test pattern for a design with four scan chains of length four bits each is shown as: {X1XX-0XXX-XX10-XXXX}, where each block of four bits is the scan-in vector for one shift cycle. The compression procedure initializes a window of a first size and a buffer of a second size. Here, the window size is eight and the buffer size is four when performing the compression. When a string (e.g., the test pattern 1002) is shifted from the buffer 1004 to the window 1006 during an encoding of the test pattern 1002, any don't care bits (shown as Xs) shifted from the buffer 1004 to the window 1006 during the encoding of the test pattern are substituted with a default value (e.g., "1") when being stored uncompressed and with a match-bit value when being stored compressed. As described in more detail below, an uncompressed symbol is encoded with two bits (flag bit+ data bit) and a compressed symbol is encoded with six bits (flag bit+three offset bits+two size bits). For the sake of this demonstration, a matching sequence is compressed even if its encoded size is larger than that of the uncompressed sequence.

In line 1, the test pattern 1002 is serialized into a string and the first bit is placed into the window 1006 and the following four bits are placed into the buffer 1004. As the bit in the window is an X, this bit is assigned a default symbol 1 and is stored as an uncompressed symbol (as "11"). The uncompressed symbol can be encoded 1008 using two bits (flag bit+data bit). Next, in line 2, the first bit in the buffer 1004 (1) shown in line 1 can be matched with the 1 in the window and this first bit can be stored as a match with offset seven and length one: represented by (7,1). The compressed one symbol can be encoded 1018 using six bits (flag bit+three offset bits+two size bits). The string can then be moved by one bit to the left, as depicted by the window 1006 and buffer 1004 in line 2. In the next iteration, XX in the buffer 1004 can match 11 in the window 1006, hence XX can be substituted with 11. The string can be moved by two bits, and the matching sequence can be stored as (6.2), representing the compressed two symbols of the two bits.

In line 3, the 0 in the buffer 1004 does not match any character in the window 1006 so this bit can be stored uncompressed (as 0) and the string can then be moved by one bit to the left as depicted in line 4. In line 4, the XXXX in the buffer 1004 can match 1110 in the window 1006, hence XXXX can be substituted with 1110. The string can be moved by four bits and stored as a match with offset 4 and length 4: (4,4) as shown in line 5. For the next bits in the buffer 1004, X10X, the longest match can be found as 1101 (at offset one with a length of four). Accordingly, X10X can be substituted with 1101 and the string can be moved by four bits and stored as (1,4). In line 6, the XXX in the buffer 1004 can match 101 in the window 1006. Thus, XXX can be substituted with 101 and the string can be moved by three bits and the matching sequence can be stored as (5,3). After seven iterations, the buffer 1004 is empty and the algorithm terminates. Note that, in order to encode the compressed string shown in line 7, {1(7,1)(6,2)0(4,4)(1,4)(5,3)}, 34 bits are used, which is more than the number of bits in the original string. This is due to the small data size and short window and buffer in this simple example.

The compressed string can be loaded to the 3D-stacked IC and decompressed on-chip using, for example, the conventional LZ77 decompression algorithm. For example, the compressed string {1(7,1)(6,2)0(4,4)(1,4)(5,3)} can be decompressed as {1111 0111 0110 1101}. The decompressed string can then be deserialized and stored in on-chip memory, from where each test vector can be accessed by selecting the corresponding on-chip memory address and performing a read operation.

In software-based compression, the window and the buffer size are not hard-coded. Therefore, the window and buffer size can be adjusted programmatically or manually (with user input) to optimize the compression ratio. Small window and buffer sizes require fewer bits to encode the offset and the length of the matched string, respectively. However, a short window reduces the probability of finding a long matching sequence and encoding it effectively. On the other hand, an unnecessarily large window does not significantly increase the probability of finding a long match but requires more bits to encode every token. Therefore, there exists an optimal window and buffer size for a particular test-data set. Data with a high X-density may benefit from a large window and buffer size, as it is likely to find a long matching sequence if only a few bits are specified. Compression of test data may be carried out at the ATE or at another system in preparation of testing.

The decompression can be performed on-chip using a compiled LZ77 decompressor, which can be loaded in the on-chip memory at the test time together with the compressed data. The parameters, including the window size, the buffer size, and the memory address to write data to, can be either fixed in the compiled program, or passed to the program as arguments (from another program and/or user input).

The compression of expected test responses, which may contain don't care bits (some of which may be masked depending on the compression method)), can be carried out by a different approach. In some embodiments, the compression of expected test responses may be achieved by the following method. First, Huffman codes can be assigned to the three symbols occurring in the stream: {X, 0, 1}→{0, 10, 11}, giving the most frequently occurring symbol (X) the shortest code. For instance, a string "X1XX0XXX" is replaced by "0110010000". Finally, a non-modified LZ77 algorithm may be applied to the coded input stream to compress the data.

After decompressing the expected results, the test responses can be compared on-chip using, for example, the routine shown in FIG. 11. This routine may be part of a diagnosis program loaded in the on-chip memory with the compressed expected test responses. Variable e[ ] is an array that holds the coded expected values j. Variable a [ ] is an array of size S holding the actual expected values i. The variable "count" stores the number of miscompares and error_list[ ] stores their locations. The ATE can read the count and/or error_list[ ] to retrieve the diagnostic information about the tests. In general, the diagnosis program when executed by the processor, causes the processor to perform a method comprising: for each test response from the module under test: comparing the test response to a corresponding decompressed expected result, and in response to an outcome of the comparing indicating a miscompare, storing the location of the test response in a log file in the on-chip memory.

As illustrated in FIG. 11, while the number of coded expected values is less than or equal to the size S of the array holding the actual expected values, a comparison is carried out whereby if an actual expected value i is true and only one of the next expected value [i+1] or the coded expected value j is true, the location of the coded expected value j is stored in the error_list[ ] and the count is incremented by one. In the algorithm of FIG. 11, the next expected value and the next coded expected value is incremented until all of the coded expected values have been analyzed. It should be understood that this algorithm is only provided for illustrative purposes and should not be construed as limiting the manner in which the comparison and/or diagnosis of the test results may be carried out.

As an example, suppose the string of the expected values is {X01} (e[ ]=01011) and the string of the actual response is {100} (a[ ]=100). At the first iteration, (j=0, e[0]=0, which indicates a don't-care bit; therefore no miscompare is detected. At the next iteration (j=1), e[1]=1, indicating a care bit; therefore the next bit in e[ ] is compared with the next bit in a[ ] (0 XOR 0), resulting in a pass. At the following iteration (j=2), e[3]=1, indicating a care bit. The coded expected value is different from the expected one, indicating a miscompare. Since the condition "1 AND (0 XOR 1)" is true, the error location is stored in the error list and the error count is incremented. The algorithm can terminate at this point with one recorded miscompare.

The described on-chip software-based testing approach does not require X-masking hardware (logic introduced in a circuit to avoid errors in diagnostics because of unknown values at the output from floating, analog or random logic)

because don't-care locations for test (diagnostic) data can be encoded in the data provided by the ATE. While comparing the expected and the actual test responses, the diagnosis program can automatically ignore don't-care bits in the test response.

As described above, testing and diagnostic methods can be carried out on-chip through software-based self-testing that takes advantage of resources of the memory-on-logic 3D IC and other ICs having on-chip memory. In particular, the testing and diagnosis method exploits resources available in the ICs, such as embedded processors and wide-I/O DRAMs, for decompression of test data into the memory, application of test stimuli from the memory to a module under test, and on-chip diagnosis of test responses.

The proposed methods reduce requirements on the test equipment, as the test application can be performed, at least in part, on-chip as opposed to completely at the ATE. In addition, the described methods enable online test using scan-based test data without extra overhead, as the test application resembles program execution in functional mode. The area overhead of the software-based compression using embedded processors and wide-I/O DRAMs available in 3D-stacked ICs is negligible for realistic designs. Furthermore, software-based compression is more flexible than hardware-based methods and can easily be adjusted to the test data in order to maximize compression.

The proposed method provides high-resolution diagnosis capabilities. The expected test responses, including the X-bounding mask, can be loaded to the IC in compressed form and then, once decompressed, used to keep track of the failing scan cells during test application.

The methods and processes described herein can be embodied as code and/or data. The software code and data described herein can be stored on one or more computer readable media, which may include any device or medium that can store code and/or data for use by a computer system (including an embedded processor of a 3D-IC or other IC with on-chip memory). When a computer system reads and executes the code and/or data stored on a computer-readable medium, the computer system performs the methods and processes embodied as data structures and code stored within the computer-readable storage medium. During testing, the computer-readable storage medium is the on-chip memory of the IC (e.g., the DRAM of the 3D IC). Of course, other memory structures may be included on chip and used to store the software, code, and data. In addition, some aspects performed off-chip (off the DUT) may include software, code and/or data stored on other computer-readable storage media.

By way of example, and not limitation, computer-readable storage media may include volatile and non-volatile, removable and non-removable media implemented in any method or technology for storage of information such as computer-readable instructions, data structures, program modules or other data. In general, computer-readable storage media include, but are not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAlVI), and magnetic and optical storage devices (hard drives, magnetic tape, CDs, DVDs); or other media now known or later developed that is capable of storing computer-readable information/data for use by a computer system. "Computer-readable storage media" should not be construed or interpreted to consist of carrier waves or propagating signals.

FIG. 12 illustrates a representative computing system that may be used to carry out certain implementations of the described IC testing. Referring to FIG. 12, computing system 1200 for an ATE system can include a processing system 1201, which may include one or more processing devices. Examples of processing system 1201 include general purpose central processing units (CPUs), application specific processors, and logic devices, as well as any other type of processing device, combinations, or variations thereof that retrieve and execute software 1202 from storage system 1203. Processing system 1201 may be implemented within a single processing device but may also be distributed across multiple processing devices or sub-systems that cooperate in executing program instructions. The one or more processing devices may include multiprocessors or multi-core processors and may operate according to one or more suitable instruction sets including, but not limited to, a Reduced Instruction Set Computing (RISC) instruction set, a Complex Instruction Set Computing (CISC) instruction set, or a combination thereof. In certain embodiments, one or more digital signal processors (DSPs) may be included as part of the computer hardware of the system in place of or in addition to a general purpose CPU.

Storage system 1203 may include any computer readable storage media readable by processing system 1201 and capable of storing software 1202. Storage system 1203 may include volatile and nonvolatile, removable and non-removable media implemented in any method or technology for storage of information, such as computer readable instructions, data structures, program modules, or other data.

Examples of storage media include computer-readable storage media such as random access memory (RAM, DRAM, SRAM), read only memory (ROM, PROM, EPROM, EEPROM), magnetic disks, optical disks, CDs, DVDs, flash memory, magnetic cassettes, magnetic tape, magnetic disk storage or other magnetic and ferromagnetic/ferroelectric storage devices, or any other suitable storage media. Certain implementations may involve either or both virtual memory and non-virtual memory. In no case is the storage media a propagated signal.

In addition to storage media, in some implementations storage system 1203 may also include communication media over which software 1202 may be communicated internally or externally. Storage system 1203 may be implemented as a single storage device but may also be implemented across multiple storage devices or sub-systems co-located or distributed relative to each other. Storage system 1203 may include additional elements, such as a controller, capable of communicating with processing system 1201.

Software 1202, including testing application 1204, may be implemented in program instructions and among other functions may, when executed by processing system 1201, direct processing system 1201 to operate as described herein for automated testing. Software 1202 may include additional processes, programs, or components, such as operating system software or other application software. Software 1202 may also include firmware or some other form of machine-readable processing instructions executable by processing system 1201. Furthermore, test data may be stored in storage system 1203 and accessed by testing application 1204 when carrying out the automated testing herein (including the transfer of compressed data to a DUT and in some cases performing the data compression).

A greater understanding of the present invention and of its many advantages may be had from the following experimental results, given by way of illustration. The following examples are illustrative of some of the methods, applications, embodiments and variants of the present invention. They are, of course, not to be considered in any way limitative of the invention.

Example: Test Data Compression Using the Described Modified LZ77

A modified version of LZ77 such as described with respect to FIG. 10 was implemented in C and applied to five industrial benchmarks, ckt-4, ckt-5, ckt-6, ckt-7, and ckt-8 that are used in Z. Wang and K. Chakrabarty, "Test Data Compression for IP Embedded Cores Using Selective Encoding of Scan Slices," in Test Conference, 2005, Proceedings. ITC IEEE, 2005, pp. 589-590. Table 1 provides some details on the industrial designs and the test sets.

TABLE 1

Description of industrial circuits and test sets

| Circuit | # gates | # scan cells | # test cubes | Test-data size (1k bits) | Fault coverage | Percentage of specified bits |
|---|---|---|---|---|---|---|
| ckt-4 | 302,714 | 43,414 | 1,528 | 66,337 | 99.42% | 1.58 |
| ckt-5 | 404,860 | 26,970 | 4,899 | 132,126 | 98.85% | 1.31 |
| ckt-6 | 1.18M | ~80,000 | 2,859 | 231,602 | 97.86% | 2.58 |
| ckt-7 | 1.21M | ~20,000 | 18,027 | 400,290 | 99.16% | 1.76 |
| ckt-8 | 1.41M | ~110,000 | 18,142 | 1,974,993 | 95.07% | 0.92 |

The proposed test techniques were evaluated using a subset of the IWLS'05 benchmarks (C. Albrecht, "IWLS 2005 benchmarks," in *Proceedings International Workshop on Logic Synthesis*, 2005). Design details about these benchmarks are presented in Table 2.

TABLE 2

Description of IWLS benchmarks

| Design | # gates | # Flip-Flops | Function |
|---|---|---|---|
| netcard | 724,043 | 97,831 | Ethernet/PCT Bridge |
| vga_lcd | 124,031 | 17,079 | VGA/LCD controller |
| ethernet | 46,771 | 10,544 | Ethernet IP core |
| RISC | 59,974 | 7,599 | 32-bit RISC CPU |
| mem_ctrl | 11,400 | 1,083 | Memory Controller |

Before the test data is compressed, the actual test vectors are extracted from the test-pattern file in STIL format and concatenated to a single string of 0s, 1s, and Xs, which is done by a simple parser. In the experimental examples, a conventional LZ77 decompressor implemented in C is used to decompress the string on chip. Another algorithm transforms the string to the format in which the test vectors are applied to the scan chains from the wide I/O DRAM. The programs for decompression and transformation are loaded to the chip together with the actual test data. However, as these programs are small in size compared to the compressed data (less than 100 KB), the size of these programs is neglected in the calculations.

The window size W and the buffer size B are varied in order to optimize the compression. Table 3 shows the compression ratio R of the test stimuli for ckt-4 for different buffer sizes B and window sizes W, where R is defined as the ratio between the uncompressed and compressed data sizes. For example, R=9 indicates that the compressed data volume is 10% of the uncompressed data volume.

TABLE 3

Compression ratios for ckt-4

| B | W=9 | 10 | 11 | 12 | 13 | 14 | 15 | 16 | 17 | 18 |
|---|---|---|---|---|---|---|---|---|---|---|
| 9 | 15.7 | 15.7 | 15.6 | 15.4 | 15.3 | 15.0 | 14.8 | 14.6 | 14.4 | 14.1 |
| 10 | | 21.2 | 21.5 | 21.6 | 21.8 | 21.8 | 21.8 | 21.8 | 21.7 | 21.6 |
| 11 | | | 26.0 | 26.7 | 27.3 | 27.7 | 28.2 | 28.6 | 28.8 | 29.0 |
| 12 | | | | 29.6 | 30.6 | 31.4 | 32.2 | 33.0 | 33.6 | 34.1 |
| 13 | | | | | 31.7 | 32.8 | 33.8 | 34.8 | 35.7 | 36.4 |
| 14 | | | | | | 32.6 | 33.8 | 34.9 | 35.8 | 36.7 |
| 15 | | | | | | | 33.3 | 34.3 | 35.2 | 36.2 |
| 16 | | | | | | | | 33.4 | 34.4 | 35.3 |
| 17 | | | | | | | | | 33.4 | 34.3 |
| 18 | | | | | | | | | | 33.4 |

As the results show in Table 3, R strongly depends on the combination of B and W. For this benchmark, it was found that B=14 and W=18 provide an optimal compression with R=36.7.

Table 4, Table 5, Table 6, and Table 7 show the compression ratios for ckt-5, ckt-6, ckt-7, and ckt-8.

TABLE 4

Compression ratios for ckt-5

| B | W=14 | 15 | 16 | 17 | 18 |
|---|---|---|---|---|---|
| 14 | 37.0 | 38.6 | 40.0 | 41.4 | 42.5 |
| 15 | | 37.5 | 39.0 | 40.3 | 41.4 |
| 16 | | | 37.8 | 39.1 | 40.3 |
| 17 | | | | 38.0 | 39.2 |
| 18 | | | | | 38.2 |

TABLE 5

Compression ratios for ckt-6

| B | W=14 | 15 | 16 | 17 | 18 |
|---|---|---|---|---|---|
| 14 | 20.5 | 21.5 | 22.4 | 23.2 | 24.0 |
| 15 | | 20.9 | 21.8 | 22.6 | 23.4 |
| 16 | | | 21.2 | 22.0 | 22.8 |
| 17 | | | | 21.4 | 22.2 |
| 18 | | | | | 21.6 |

TABLE 6

Compression ratios for ckt-7

| B | W=14 | 15 | 16 | 17 | 18 |
|---|---|---|---|---|---|
| 14 | 27.8 | 29.6 | 30.8 | 32.1 | 33.3 |
| 15 | | 28.7 | 20.0 | 31.25 | 32.4 |
| 16 | | | 29.1 | 30.4 | 31.5 |
| 17 | | | | 29.5 | 30.7 |
| 18 | | | | | 29.9 |

TABLE 7

Compression ratios for ckt-8

| B | W=14 | 15 | 16 | 17 | 18 |
|---|---|---|---|---|---|
| 14 | 52.0 | 54.4 | 56.6 | 58.6 | 59.8 |
| 15 |  | 53.4 | 55.8 | 57.9 | 59.8 |
| 16 |  |  | 54.3 | 56.5 | 58.5 |
| 17 |  |  |  | 54.9 | 56.9 |
| 18 |  |  |  |  | 55.4 |

The best (optimal) combination of W and B were picked from the obtained results for each benchmark and the compression ratio of the proposed method was compared with that proposed in Z. Wang and K. Chakrabarty, "Test Data Compression for IP Embedded Cores Using Selective Encoding of Scan Slices," Test Conference, 2005, Proceedings. ITC IEEE, 2005, pp. 589-590. This comparison is shown in Table 8. As shown in Table 8, the results indicate that the proposed method achieves a considerably higher test-data compression ratio than the method in the Z. Wang and K. Chakrabarty paper ("selective encoding"), 2× or more in almost all cases.

TABLE 8

Comparison of proposed method with selective encoding method

|  | ckt-4 | ckt-5 | ckt-6 | ckt-7 | ckt-8 |
|---|---|---|---|---|---|
| Selective Encoding | 20.32 | 21.73 | 10.28 | 15.49 | 28.82 |
| Proposed method | 36.7 | 42.5 | 24.0 | 33.3 | 59.8 |

The proposed method was also compared with hardware-based XOR compression implemented in a commercial tool from a major electronic design automation (EDA) vendor. The comparison was carried out using the IWLS'05 benchmarks listed in Table 2. For these experiments, the compression ratio of test stimuli were examined using different scan chain-to-scan channel ratios. For ethernet and vga_lcd, the ratios 1000:6, 1000:10, and 500:10 were used as R1, R2, and R3, respectively. For RISC and mem_ctrl, the ratios 100:10, 75:10, and 50:10 were used as R1, R2, and R3, respectively. Table 9 summarizes the compression ratio and test-application time with XOR compression. The first part of Table 9 summarizes the XOR compression $\beta_X$ obtained for three different settings, as well as the LZ77 compression $\beta_S$. The baseline for this comparison is a test-pattern set generated without compression and X-filling. The chain-to-channel ratios for XOR compression were limited in order to have a fault-coverage drop of no more than 0.1%.

TABLE 9

Comparison of compression ratio and test-application time with XOR compression using a commercial tool

| Circuit | α | $\beta_X$ | $\beta_S$ | $\beta_{XS}$ | $T_{S,w}/T_X$ | $T_{S,b}/T_X$ | $T_{XS}/T_X$ |
|---|---|---|---|---|---|---|---|
| netcard | 200:10 | 47.0 | 93.0 | 84.5 | 2.85 | 2.45 | 1.06 |
|  | 500:10 | 106.5 | 93.0 | 188.1 | 3.27 | 2.13 | 1.07 |
|  | 1000:10 | 192.9 | 93.0 | 333.4 | 4.00 | 2.07 | 1.12 |
| ethernet | 200:10 | 19.5 | 17.2 | 27.5 | 2.11 | 1.13 | 1.21 |
|  | 500:10 | 34.7 | 17.2 | 43.0 | 2.66 | 2.02 | 1.31 |
|  | 1000:10 | 38.9 | 17.2 | 48.2 | 2.72 | 2.27 | 1.31 |
| vga_vlc | 200:10 | 24.7 | 36.7 | 40.7 | 1.91 | 1.24 | 1.11 |
|  | 500:10 | 49.0 | 36.7 | 74.7 | 2.32 | 1.34 | 1.15 |
|  | 1000:10 | 66.4 | 36.7 | 97.6 | 2.48 | 1.81 | 1.18 |
| RISC | 50:10 | 4.8 | 5.3 | 6.6 | 1.89 | 0.97 | 1.23 |
|  | 75:10 | 6.7 | 5.3 | 8.7 | 2.17 | 1.27 | 1.27 |
|  | 100:10 | 8.7 | 5.3 | 10.5 | 2.52 | 1.64 | 1.33 |
| mem_ctrl | 50:10 | 3.4 | 3.3 | 4.2 | 1.75 | 1.05 | 1.32 |
|  | 75:10 | 4.1 | 3.3 | 4.6 | 1.81 | 1.26 | 1.39 |
|  | 100:10 | 4.8 | 3.3 | 5.2 | 1.95 | 1.46 | 1.41 |

As shown in Table 9, for high chain-to-channel ratios, the conventional XOR method provides better compression. However, such high ratios can be impractical as they require an excessive number of very short internal scan chains that results in high scan-chain routing overhead. The results indicate that for lower chain-to-channel ratios, the proposed method outperforms the compression of the traditional XOR compression. In contrast to XOR compression, LZ77 software-based compression is independent of the chain-to-channel ratio and can fully benefit from test equipment with high bandwidth, even if the number of scan chains is relatively low. The above comparison does not include compression of test responses.

The proposed technique can be used in several ways. It can serve as the only test-data compression mechanism for manufacturing test, replacing traditional hardware-based compression. Alternatively, software-based compression can also be used in combination with the traditional XOR-based method to further increase compression. The experimental data generated with a commercial ATPG tool shows that the number of load bits set to 0 is much higher than those set to 1 due to XOR decompression. This can be exploited to further compress test stimuli using software. The test-application scheme can be the same as that shown in FIG. 4, with the difference that the decompressed data goes through a hardware XOR decompressor. LZ77 was applied on the load data of the uncompressed test patterns and the combined compression $\beta_{XS}$ was calculated for this approach. The results presented in Table 9 show that the compression can be increased significantly when combining software-based compression and XOR compression.

The benefits of the proposed method may be further seen with respect to fault diagnosis. In traditional hardware-based XOR compression methods, test responses are usually compacted to signatures using a multiple-input shift register (MISR). The disadvantage of this method is the low diagnosability resolution for fault isolation and additional tester bandwidth required to alleviate the problems caused by X-masking. Due to lossy compaction, a response signature can map to a large number of test responses. In case of a signature mismatch, a number of additional test patterns may need to be generated and applied to the circuit in order to narrow down to the scan cells capturing erroneous data. The proposed software-based compression method allows for high on-chip diagnosability resolution using compressed test responses with implicit X-masking information. In case of a mismatch, failing scan cells can be identified without the application of additional test patterns. In addition to this on-chip diagnosis, conventional MISR compaction can be implemented and switched on at test-application time, for instance, if only pass-fail information is required.

Besides test-data volume, test-application time is another performance metric of a test method. The test-application time of the proposed method was estimated and compared with that of XOR-based compression. For XOR-based compression, the test-application time can be expressed as $T_X=D_X/C$, where C is the number of test channels and $D_X$ is test-data volume calculated as #patterns×#channels×(scan length). It is assumed that the number of capture cycles is much less that the number of shift cycles the number of capture cycles are neglected. In addition, it is assumed that the channels for load and unload are balanced, such that the volume of unload data equals the volume of load data. In a simple implementation of the proposed method, writing to DRAM, processing of test data, and scan are done in sequential fashion, so the total test application time Ts is calculated as $T_{S,w}=T_{S,mem}+T_{S,scan}$, where $T_{S,mem}$ is the time required to upload and download the test data to DRAM and $TS,scan$ is the actual scan application time. The time required for on-chip decompression and test-response analysis is neglected for this comparison because these operations are performed on-chip and their execution time is mainly limited by the wide-I/O bandwidth. This time is in the order of the time required to read and write an uncompressed data set into memory. However, the wide-I/O memory throughput is much higher than that for scan operations. Hence, the time required for decompression and test-response analysis is much shorter than $T_{S,scan}$ and can be neglected in this approximation.

Since the test data is uploaded through the tester channels, $T_{S,mem}$ can be expressed as $T_{S,mem}=D_S/C$, where $D_S$ is the Volume of Compressed Test-Data Using Software-Based Compression. The actual scan of decompressed data is directly applied to N scan chains, such that the scan time can be calculated as $T_{S,scan}=D_U/N$, where $D_U$ is the uncompressed data volume. With the chain-to-channel ratio $\alpha=N/C$, XOR test compression ratio $\beta_x=D_u/D_x$, and software-based compression ratio $\beta_s=D_u/D_s$, the test-application time of the proposed method can be simplified as $TS,w=\beta_X(1/\alpha+1/\beta_S)T_X$. Therefore, the factor $\beta_X(1/\alpha+1/\beta_S)$ represents the test-application time increase compared to traditional XOR-based method. In a more sophisticated implementation of the proposed approach, the test data can be partitioned and applied to the circuit in a pipelined fashion. Hence, a lower bound for the test application time may be given as $$T_{S,b} = \max\left\{\frac{\beta_X}{\alpha}T_X, \frac{\beta_X}{\beta_S}T_X\right\}.$$

Table 9 presents the estimated worst test-application times $T_{S,w}$ and the best test-application times $T_{S,b}$. Even though the test-application time in the proposed method is longer than that of the XOR solution provided by the commercial tool, it is possible to achieve higher compression for designs with low chain-to-channel ratios, and additional compression may be achieved using a hybrid approach as discussed above. In addition, the average test time per 3D IC can be reduced with multi-site testing. In traditional XOR-based designs, the test responses are usually transferred back to the tester through separate tester channels. In contrast, certain implementations enable both the test stimuli and the expected test responses to be broadcasted (by an ATE) to multiple 3D ICs that are tested in parallel, as these data is identical for all 3D ICs. Only a relatively small signature from the diagnosis program needs to be transferred back to the tester from each 3D IC in a multiplexed manner. Therefore, if multiple 3D ICs are tested in parallel, the average test time per 3D IC will be shorter compared to that of XOR-based designs.

In case of a hybrid approach, the total test-application time $T_{XS}$ is slightly increased compared to $T_X$ due to the time used to upload the test stimuli to the DRAM prior to scan. This is acceptable in view of the benefit of much higher compression compared to a pure XOR solution.

Traditional, hardware-based compression techniques typically use test-response compactors, for instance, MISRs or XOR compactors. With lossy compaction, accurate diagnosis of the failing scan cells becomes considerably difficult. If diagnosis of failing ICs is required, a common approach is to disable the compression and reapply the failed test patterns or a subset of patterns that contains the failed patterns. In the proposed method, however, a lossless compression can be used for expected test responses; therefore, it is possible to identify and keep track of every scan cell capturing erroneous value without reapplication of failed test patterns.

Figure 13:
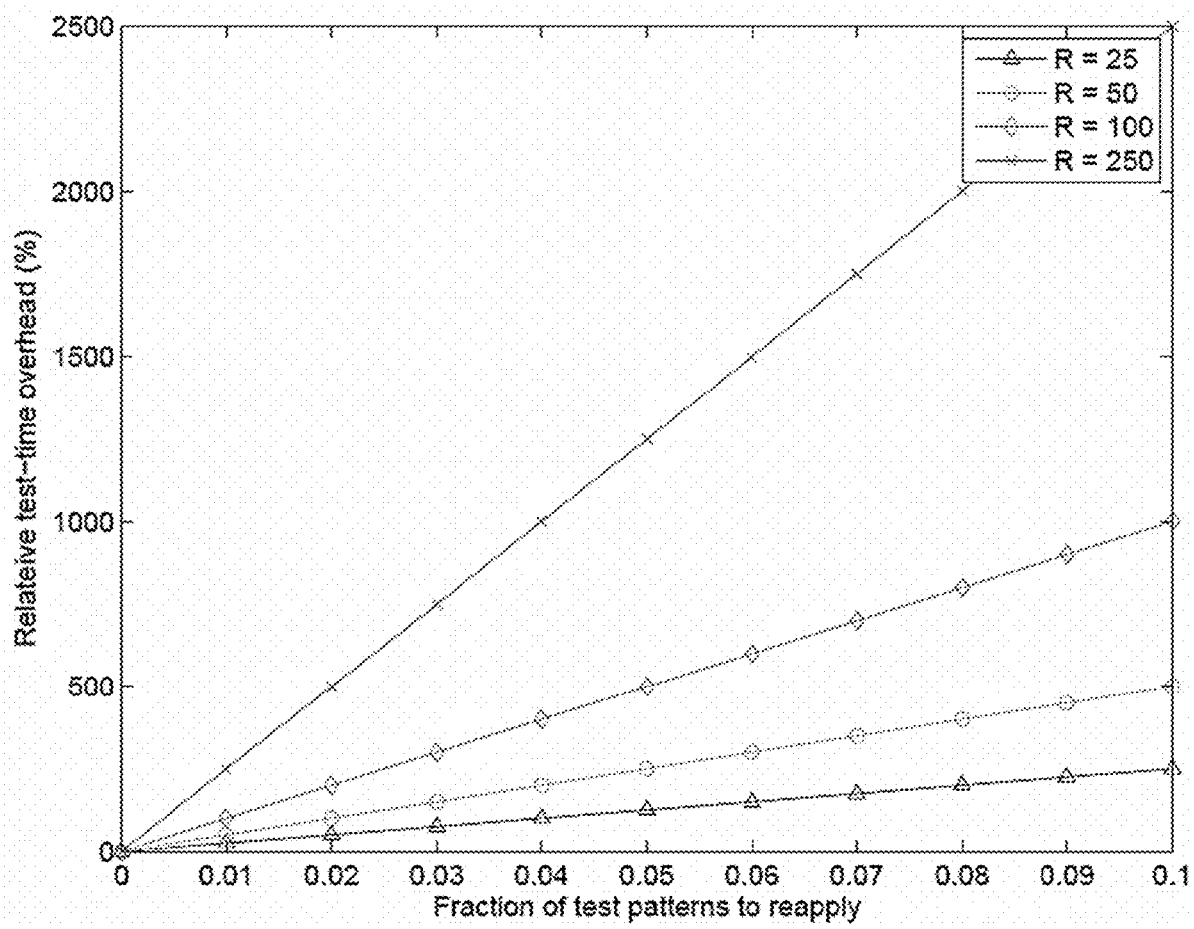
FIG. 13 shows plots of R for realistic values of γ and R.

An analysis was carried out of test-time overhead due to diagnosis using conventional XOR-based compression. Suppose R is the chain-to-channel ratio used in the response compactor. In order to scan out a test pattern after bypassing the compressor, R times more clock cycles are required. Hence the re-application of a pattern in bypass mode takes approximately R times longer than test application in compression mode. If $T_{comp}$ is the test-application time of a compressed test pattern set, and γ is the fraction of the pattern set that needs to be re-applied without compression for diagnosis, the total test time can be expressed as $T_{comp}+\gamma RT_{comp}.$ The factor γR is the relative overhead due to pattern reapplication. FIG. 13 shows plots of R for realistic values of γ and R. Even if only a small fraction of the number of test patterns needs to be re-applied for diagnosis, the test time using traditional XOR-based compression increases drastically, and a small number of failing dies are diagnosed for failing scan cells in practice.

In contrast to the above scenario, certain embodiments of the proposed test-application method enable accurate diagnosis without pattern re-application. Therefore, assuming the same test-equipment resources, it is possible to gather information about failing scan cells from all ICs under test without significant time overhead. As this information is used during yield learning, the proposed test-application method can offer major benefits for ramp-up to volume production.

Example: Simulation of the Described DfT Circuitry for Test Application

Figure 14:
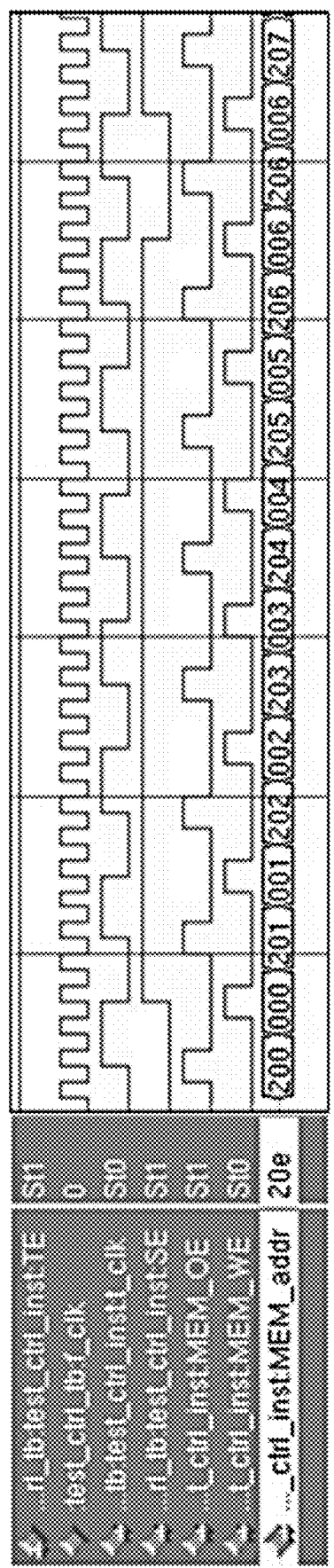
FIG. 14 shows a simulation waveform for a Verilog RTL model of the DfT control circuitry of FIG. 5B.

A Verilog RTL model of the DfT circuitry shown in FIG. 4 was created and synthesized to a 45 nm CMOS library. For a realistic scenario with n=512, pattern count of 1000, and maximum scan-chain length of 1000, the standard-cell area of the synthesized DfT circuitry is 27,915 $\mu m^2$. This is about 0.11% of the area of a realistic 3D die with the area 25 $mm^2$, which is negligible. The functions of the design, including application of test stimuli from DRAM and storage of test responses into DRAM, were verified using a commercial digital simulator. FIG. 14 shows a simulation waveform for a Verilog RTL model of the DfT control circuitry of FIG. 5B. In this testbench, the test pattern counter was initialized to four, the scan-chain length was initialized to six, the starting DRAM address for test stimuli was assigned to 0x201, and the starting DRAM address for test responses was assigned to 0x001. Test clock t_clk is generated on-chip by dividing functional clock f_clk. As the FSM reaches the shift state, SE is asserted for six cycles of f_clk. On rising edges of f_clk, MEM_OE is asserted, test stimuli are read from DRAM and applied to the scan chains. On falling edges of f_clk, MEM_WE is asserted, test responses are stored into DRAM. MEM_addr alternates between stimuli and response addresses that are incremented while in shift state.

It should be understood that the examples and embodiments described herein are for illustrative purposes only and that various modifications or changes in light thereof will be suggested to persons skilled in the art and are to be included within the spirit and purview of this application.

We claim:

1. An integrated circuit (IC) with design-for-test (DfT) circuitry, the IC comprising:
   an on-chip memory;
   at least one scan chain for testing a module of the IC; and
   a test control circuitry receiving test signals and outputting: control signals for writing and reading to the on-chip memory, control signals for applying test data to the at least one scan chain, and a control signal to enable test responses from the at least one scan chain to be written to the on-chip memory;
   wherein the test control circuitry comprises:
      a first register for holding a memory address of a current scan-in vector;
      a second register for holding a memory address of a current scan-out vector;
      a first counter for holding a number of a current shift cycle;
      and a finite state machine (FSM) that operates a test procedure.

2. The IC of claim 1, wherein the test control circuitry further comprises:
   a configuration shift register connected to at least one of the test signals received by the test control circuitry, wherein the configuration shift register holds a length of the scan chains, a number of test patterns, at least one memory address where test stimuli are stored and at least one memory address of where to write test responses,
   wherein, during an operation of the FSM in which the FSM is moved to an initialization state, content of the configuration shift register is copied to at least the first register, the second register, and the first counter.

3. The IC of claim 1, wherein the FSM operates the test procedure comprising:
   in response to a test enable (TE) signal of the test signals received by the test control circuitry:
      moving the FSM from a reset state to an initial state in which the first register, the second register, and the first counter are initialized,
      moving the FSM to a shift state in which the first counter is decremented and a shift enable (SE) signal of the controls signals output by the test control circuitry is asserted for a time allowing a full test pattern to be scanned in,
      moving the FSM to a capture mode state in which a capture clock cycle is issued, and
      moving the FSM to the shift state in which the first counter is decremented and the SE signal is asserted for the time allowing the full test pattern to be scanned in.

4. The IC of claim 1, wherein the test control circuitry further comprises:
   a second counter for holding a number of a current test pattern, wherein the FSM operates the test procedure comprising:
      in response to a test enable (TE) signal of the test signals received by the test control circuitry:
         moving the FSM from a reset state to an initial state in which the first register, the second register the first counter, and the second counter are initialized, wherein the first counter is initialized to a length of a longest scan chain of a test pattern,
         moving the FSM to a shift state in which the first counter is decremented and a shift enable (SE) signal of the controls signals output by the test control circuitry is asserted for a time allowing a full test pattern to be scanned in, and
         until the second counter reaches zero:
            moving the FSM to a capture mode state in which a capture clock cycle is issued and the second counter is decremented,
            moving the FSM to an intermediate initial state in which the first counter is initialized to the length of the longest scan chain, and
            moving the FSM to the shift state in which the first counter is decremented and the SE signal is asserted for the time allowing the full test pattern to be scanned in.

5. The IC of claim 1, wherein the on-chip memory comprises a wide I/O dynamic random access memory (DRAM) stack.

6. The IC of claim 1, wherein the test control circuitry is embodied by a cache of the IC.

7. The IC of claim 1, wherein the test signals comprise a test enable (TE) signal, a functional clock signal, and a test-data-in (TDI) signal.

8. The IC of claim 7, wherein the test signals are received via a JTAG test access port (TAP).

9. The IC of claim 7, wherein the test signals are received via a processor of the IC.

10. The IC of claim 1, wherein the control signals for writing and reading to the on-chip memory comprise an output enable (OE) signal for reading data from the on-chip memory, a write enable (WE) signal for writing data to the on-chip memory, and an address select control signal for selecting a memory address of the on-chip memory to write to or read from, the control signals for applying test data to the at least one scan chain comprise a scan clock signal for the at least one scan chain, and the control signal to enable test responses from the at least one scan chain to be written to the on-chip memory comprises a shift enable (SE) signal for the at least one scan chain.

* * * * *